United States Patent
Wytman

(12) 
(10) Patent No.: US 6,454,864 B2
(45) Date of Patent: *Sep. 24, 2002

(54) TWO-PIECE CHUCK

(75) Inventor: Joseph Wytman, San Jose, CA (US)

(73) Assignee: CuTek Research, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/332,213

(22) Filed: Jun. 14, 1999

(51) Int. Cl.[7] ............................................. C23C 16/00
(52) U.S. Cl. ..................... 118/728; 118/729; 118/500; 269/21; 279/128
(58) Field of Search ................................ 118/728, 729, 118/500; 269/21; 279/128

(56) References Cited

U.S. PATENT DOCUMENTS

| | | | | |
|---|---|---|---|---|
| 4,086,870 A | * | 5/1978 | Canavello et al. | 118/52 |
| 5,000,827 A | * | 3/1991 | Schuster et al. | 204/15 |
| 5,024,746 A | | 6/1991 | Stierman et al. | |
| 5,095,848 A | * | 3/1992 | Ikeno | 118/53 |
| 5,256,274 A | * | 10/1993 | Poris | 205/123 |
| 5,368,711 A | * | 11/1994 | Poris | 204/193 |
| 5,429,733 A | * | 7/1995 | Ishida | 204/224 |
| 5,437,777 A | * | 8/1995 | Kishi | 204/224 |
| 5,441,629 A | * | 8/1995 | Kosaki | 205/148 |
| 5,447,615 A | * | 9/1995 | Ishida | 204/224 |
| 5,516,414 A | * | 5/1996 | Glafenhein et al. | 205/50 |
| 5,830,805 A | * | 11/1998 | Shacham-Diamand et al. | 438/678 |
| 5,853,559 A | * | 12/1998 | Tamaki et al. | 205/157 |

FOREIGN PATENT DOCUMENTS

JP    2628886    *  7/1997

OTHER PUBLICATIONS

Contolini, R., et al., A Copper Via Plug Process by Electrochemical Planarization, 1993 VMIC Conference–102/93/0470, Jun. 8–9, 1993, pp. 470–477.

Pai, Pei–Lin & Ting, Chiu, Copper as the Future Interconnection Material, 1989 VMIC Conference, TH–0259–2/89/0000–0258, Jun. 12–13, 1989, pp. 258–264.

Contolini, R., et al., Copper Electroplating Process for Sub–Half–Micron ULSI Structures, 1995 VMIC Conference–104/95/0322, Jun. 27–29, 1995, pp. 322–328.

Ting, Chiu H., et al., Recent Advances in CU Metallization, 1996 VMIC Conference, 106/96/0481(c), Jun. 18–20, 1996, pp. 481–486.

Contolini, Robert J., et al., Electrochemical Planarization for Multilevel Metallization, J. Electrochem. Soc., Vol. 141, No. 9, Sept. 1994, pp. 2503–2510.

Equinox–Single Substrate Processing System, A Semitool Brochure, EQU025–4/94, pp. 1.8–8.8.

* cited by examiner

*Primary Examiner*—Robert Kunemund
*Assistant Examiner*—Charlotte A. Brown
(74) *Attorney, Agent, or Firm*—Blakely Sokoloff Taylor & Zafman LLP

(57) ABSTRACT

A two-piece chuck for supporting a substrate in which a base plate allows the wafer to tilt and also exposes the underside of the wafer during wash/rinse cycle as well as during load/unload operations.

12 Claims, 7 Drawing Sheets

TWO-PIECE CHUCK

BACKGROUND OF THE INVENTION

1. Field of the Invention

The present invention relates to the field of semiconductor wafer processing and, more particularly, to a two-piece chuck for supporting a wafer in a processing chamber.

2. Related Application

This application is related to a co-pending application titled "Compliant Wafer Chuck;" Ser. No. 09/293,012; filed Apr. 16, 1999; issued as U.S. Pat. No. 6,241,925.

3. Background of the Related Art

Various processing chambers are known in the art for processing semiconductor wafers, such as silicon wafers. Present practices include the manufacture of integrated circuit devices on the wafer by fabricating multiple levels of conductive (typically metal) layers above a substrate of the wafer. The multiple metallization layers are employed in order to accommodate higher densities as device dimensions shrink. Likewise, the size of interconnect structures also need to shrink in order to accommodate the smaller dimensions. The various processing chambers are utilized to deposit or remove materials in order to fabricate the integrated circuits. For example, deposition techniques include processes such as physical vapor deposition (PVD), chemical vapor deposition (CVD), sputtering, and immersion of the wafer in an electrolyte. Similarly, a number of techniques are known for removing a material from a wafer. These techniques include reactive ion etching (RIE), plasma etching, chemical-mechanical polishing (CMP), and immersion of the wafer in an electrolyte.

Typically, the practice involves the complete placement of a wafer or wafers in the processing chamber. In single wafer processing, the wafer is typically placed on a chuck, which resides or is made to reside within the confines of the chamber. The chuck may be rotated to rotate the wafer. The chucks provide a hard upper surface upon which the wafer resides. The chuck is positioned so that all of the wafer resides within the interior walls of the processing chamber.

However, another line of processing chambers utilize the wafer to form the floor of the containment area for the processing fluid. For example, in a processing chamber described in U.S. Patent Application entitled "Process chamber and Method for Depositing and/or Removing Material on a Substrate;" Ser. No. 08/916,564; filed Aug. 22, 1997; and assigned to the assignee of this application, a processing surface of the wafer forms the floor of the inner containment chamber, which holds the processing fluid for processing the exposed wafer surface. Another example of a processing chamber in which the wafer forms the floor of the containment vessel is described in U.S. Patent Application entitled "Method and Apparatus for the Disposal of Processing Fluid Used to Deposit and/or Remove Material on a Substrate;" Ser. No. 09/118,362; filed Jul. 17, 1998; and also assigned to the assignee of this application.

In both examples, the processing fluid is an electrolyte for processing the wafer. The electrolyte is retained in the confined area bounded by the sidewalls and the wafer, which wafer forms the base or floor of the confined area. In order to achieve this confinement, the sidewalls (at least a portion of it) mate to the periphery (edge) of the wafer. Generally, once the wafer is placed upon a chuck, the chuck and the wafer are raised until the wafer edges mate to the bottom surface of the sidewalls of the containment vessel. A seal, such as an O-ring, is typically required to hold the fluid within the vessel and/or to protect electrodes, where electrodes are mated to the outer edge of the wafer.

When prior art chucks are utilized, two significant problems are noted. These problems are generally attributable to the solid one-piece design of the chucks. In order to maintain tight seal integrity around the circumference of the wafer's edge where the sidewall joins the wafer surface, the mating boundary between the sidewall and the wafer's surface cannot exceed a given tolerance. Yet, due to mis-alignment, tolerance imperfections, pressure changes within the vessel, O-ring wear and deterioration (as well as for other reasons), it is difficult to maintain tight seal integrity at the boundary. This is further complicated when a thin O-ring is used. A thin O-ring is desirable in order not to reduce the processing area on the face of the wafer. Maintaining a tight tolerance is difficult to achieve using thin O-rings. Also, with thinner O-rings the seal integrity breakdown can occur at much lower pressure.

The problem is amplified when larger diameter wafers are being processed, since the contact area is over a larger circumference. Since the wafer is residing on a flat rigid surface of the chuck, the wafer is not flexible to adjust to any gap separation distance which exceeds the tolerance. The leakage of the fluid can adversely affect the performance of the system, since the fluid can contact the backside of the wafer itself and/or the electrodes contacting the edge of the wafer (if such electrodes are present).

The second problem is leakage and/or wetting on the underside of the wafer. Typically, the electrolyte is prevented from leaking to the underside of the wafer when the wafer is engaged to the chamber. When the wafer is washed/rinsed to remove the electrolyte, the wafer is lowered, in order to be disengaged from the chamber. At this lower position, the cleaning of the wafer is performed, typically by the spraying of deionized water. During this cleaning procedure, there is a tendency for the water to penetrate between the underside of the wafer and the chuck surface. Even if a seal is present, the water penetration is likely, since the edge of the chuck resides proximal to the wafer's edge. Furthermore, the presence of vacuum on the chuck surface to hold the wafer in place during the rinse and spin cycle can attract and/or retain liquid droplets. That is, the vacuum, not only attracts the liquid, but can also retain the liquid in the vacuum opening or channel. Subsequently, when the vacuum is removed, such as to remove the wafer, the liquid spurts from the vacuum opening and wets the underside of the wafer. When the wafer is removed, even after a spin dry cycle which removes the liquid from the face of the wafer, the liquid is present on the underside of the wafer.

Accordingly, what is needed is a scheme in which unwanted sidewall-wafer gap separation is reduced or prevented when semiconductor wafers are processed in a processing chamber, especially where the wafer forms the floor of the containment region. Furthermore, it would be beneficial for the chuck to reduce the risk of backside wetting.

SUMMARY OF THE INVENTION

A two-piece wafer chuck for supporting a substrate. The chuck is comprised of a base plate for supporting an outer peripheral area of the wafer residing thereon and a central disk, which resides within a central open region of the base plate. When mounted, the base plate moves relative to the fixed central disk so that the wafer edges can tilt to properly mate to a processing chamber. The base plate is coupled to an inner shaft which allows the base plate to be lowered relative to the central disk, in order to expose the underside of the wafer.

DETAILED DESCRIPTION OF THE INVENTION

A two-piece chuck (also referred to as a wafer support, platen, or platform) for use with a processing chamber is described. In the following description, numerous specific details are set forth, such as specific structures, materials, processes, etc., in order to provide a thorough understanding of the present invention. However, it will be appreciated by one skilled in the art that the present invention may be practiced without these specific details. In other instances, well-known techniques and structures have not been described in detail in order not to obscure the present invention.

Figure 1:
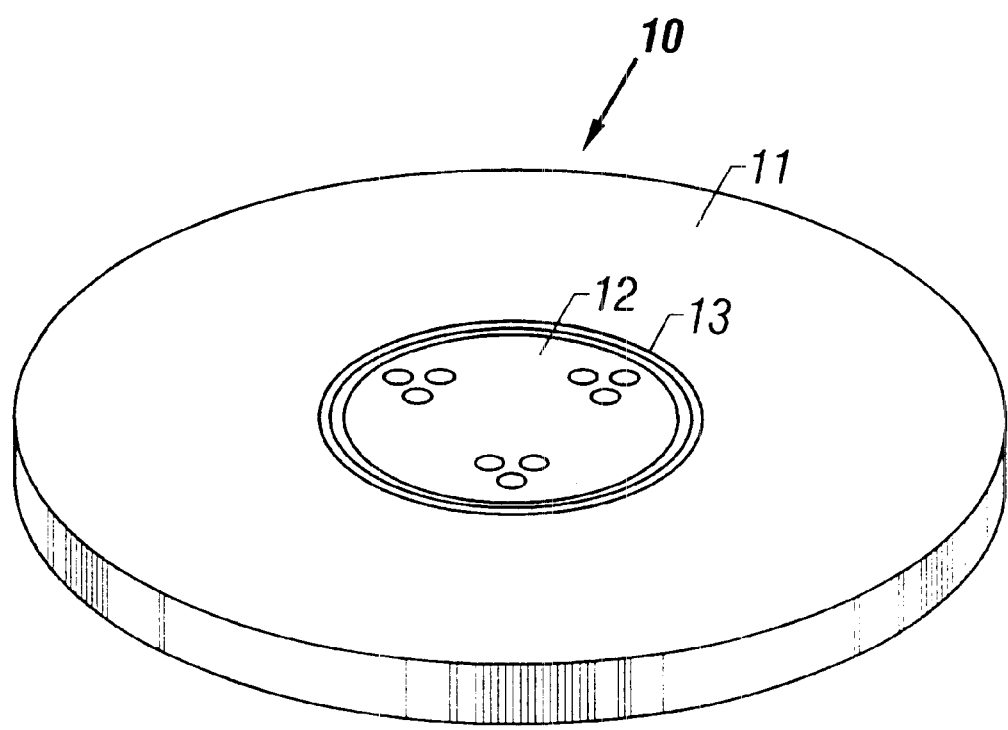
FIG. 1 is a pictorial illustration of the two-piece wafer chuck of the present invention.
Figure 2:
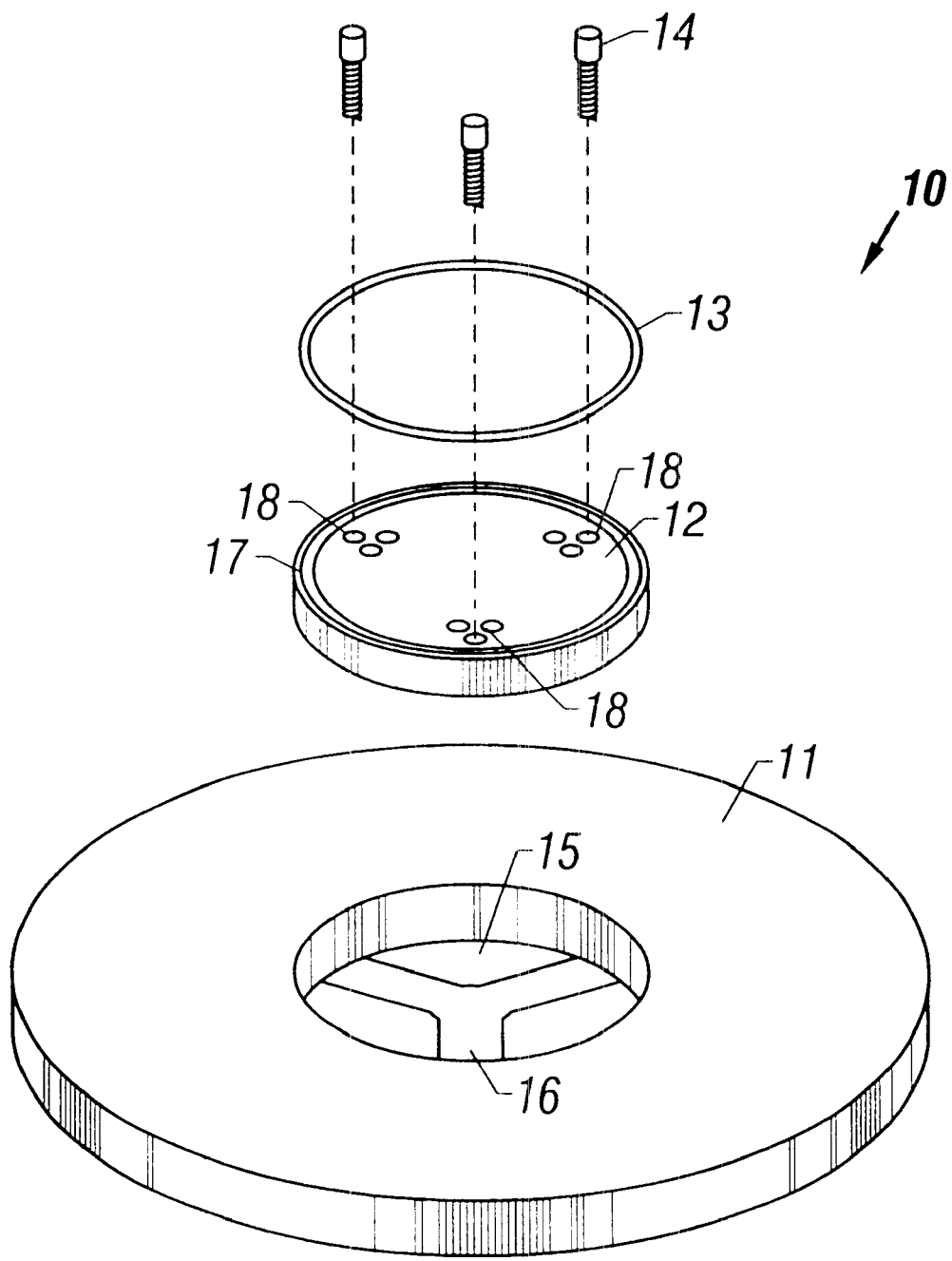
FIG. 2 is an exploded view of the wafer chuck of FIG. 1.

Referring to FIG. 1, a two-piece chuck 10 of the preferred embodiment of the invention is illustrated. An exploded view of the chuck 10 is shown in FIG. 2. The wafer chuck 10 is comprised of two main pieces, a chuck base plate 11 and a central disk plate 12. A seal, in the form of an O-ring 13, along with mounting hardware 14 for mounting the central disk 12, are also shown in FIG. 2.

The base plate 11 is planar on its upper surface for having a substrate, including a semiconductor substrate (such as a silicon wafer) reside thereon. The base plate 11 is circular in shape and of sufficient diameter to accommodate and support a circular wafer of a particular diameter. Current generation silicon wafers are 200 mm and 300 mm. However, the base plate 11 can be sized to accommodate other wafer sizes as well. It is generally desirable to have the diameter of the base plate 11 slightly larger than the diameter of the wafer, in order to provide support at the edge of the wafer.

At the center of the base plate 11, a central opening 15 is present. The opening 15 in the embodiment shown is also circular and concentric to the base plate 11. The opening 15 is of sufficient diameter to accommodate the central disk plate 12 at the concentric center of base plate 11. As shown in FIG. 2, the bottom of the base plate 11 has tri-finger extensions 16, which form a portion of the floor of opening 15. In the example, the extensions (or fingers) 16 are at 120 degrees apart and meet at the center. When the central disk 12 is inserted into the opening, the extensions prevent the disk 12 from passing completely through the opening 15. Accordingly, the opening 15 can also be designed as a recessed opening. Furthermore, when the disk 12 resides upon the extensions 16, the upper surfaces of the base plate 11 and the central disk 12 are substantially at the same level, so that both plates 11, 12 are planar to support a wafer residing thereon.

The central disk 12 is shown having several holes on its surface. The holes extend completely through the disk 12. Holes 18 are for having the mounting hardware 14 (such as screws, bolts, etc.) extend through the disk for mounting the disk 12 to a shaft. Holes 19 are utilized for a vacuum channel to the surface. The vacuum is utilized to hold the wafer on the disk 12. A groove 17 is also present along the outer periphery of the disk 12 for having the O-ring 13 reside therein. The O-ring provides a seal when the upper surface of the disk 12 has a wafer residing thereon.

Figure 3:
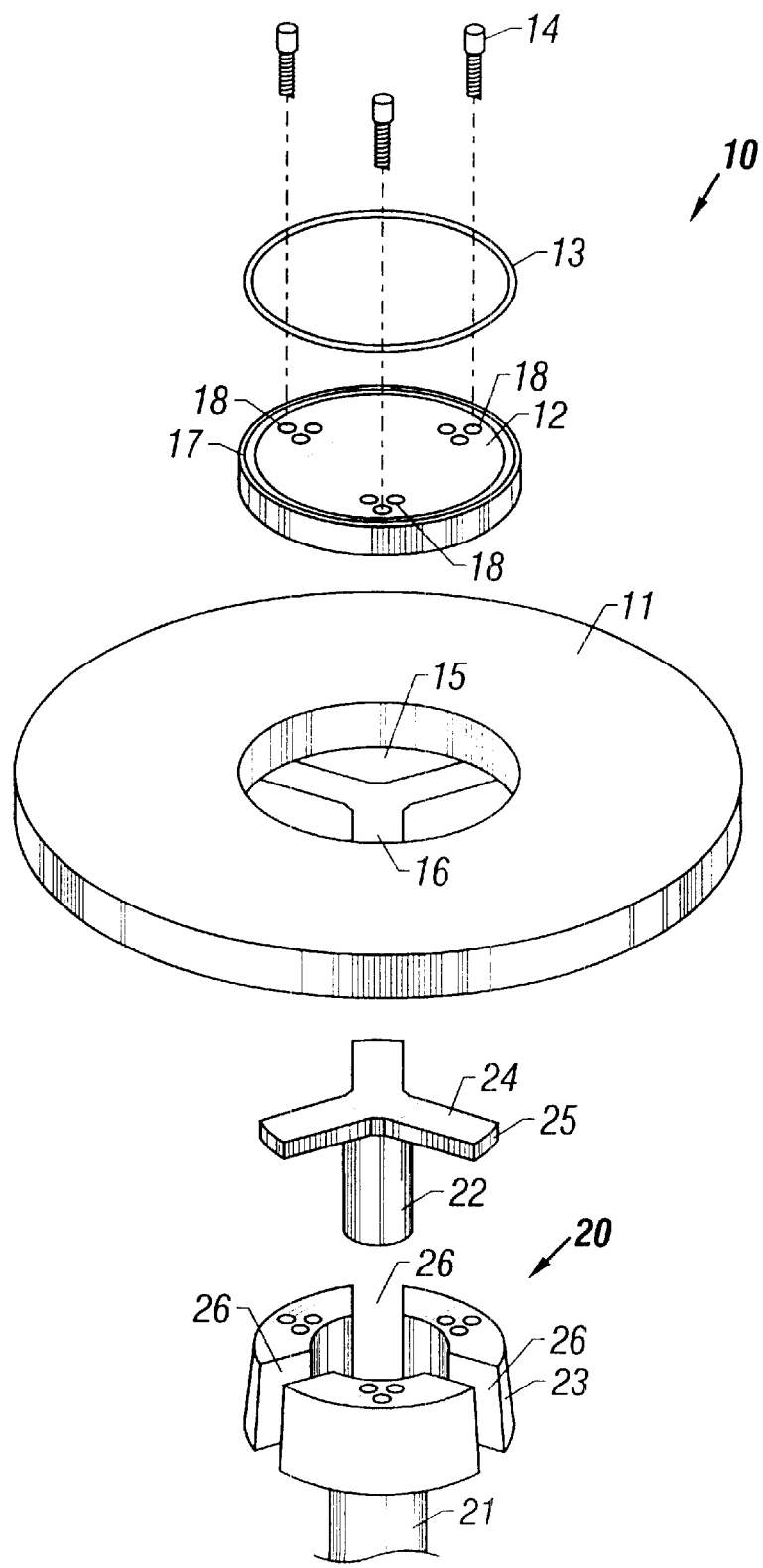
FIG. 3 is a pictorial illustration of the wafer chuck of FIG. 2 as it mates to a shaft assembly having an inner shaft and an outer shaft.
Figure 4:
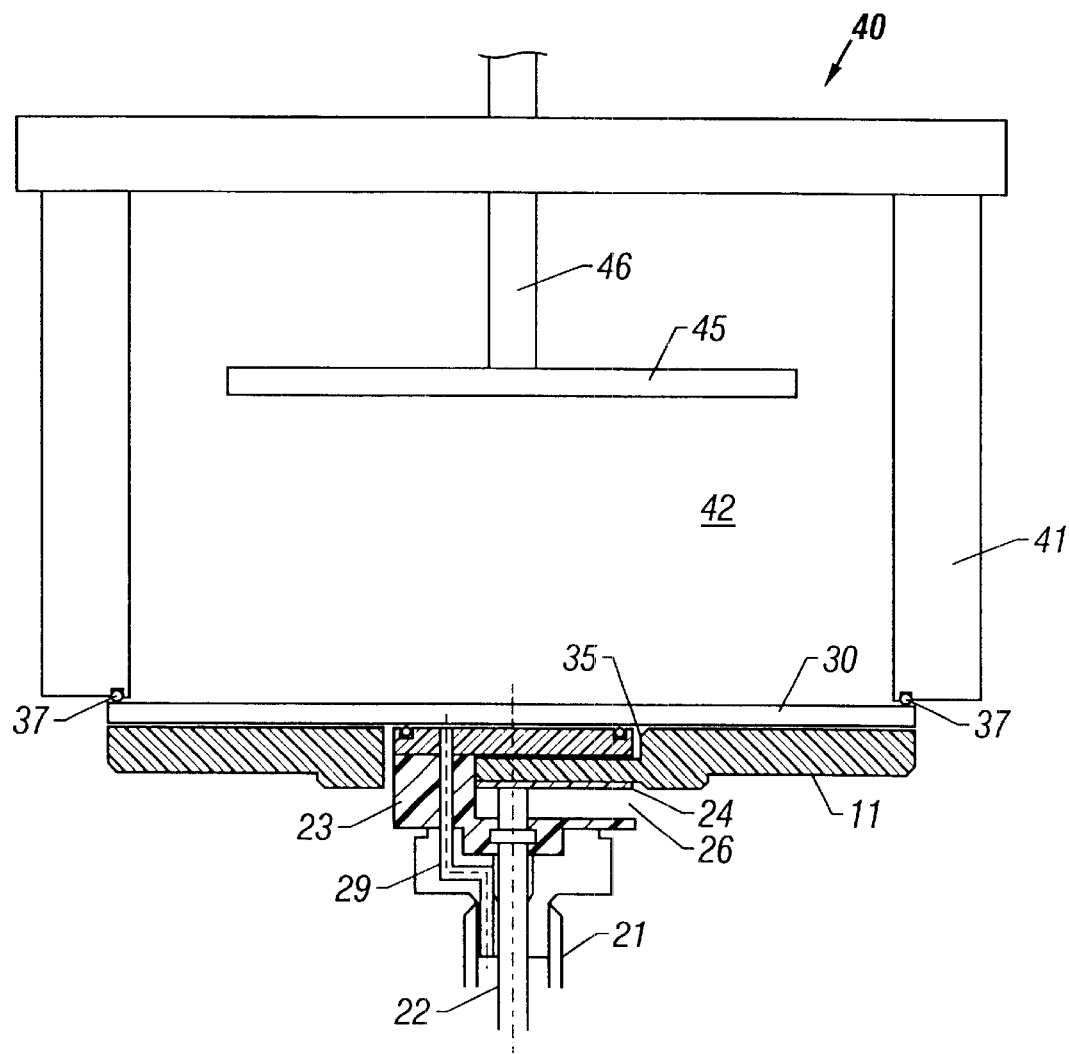
FIG. 4 is a cross-sectional view of the two-piece chuck of FIG. 1 when a wafer is placed into a processing position within a chamber, in which the wafer forms the floor of the containment vessel holding a processing fluid.

Referring to FIGS. 3 and 4, the chuck 10 is better understood when referenced with a shaft assembly 20 coupled to it. The shaft assembly 20 is comprised of an outer shaft 21 and an inner shaft 22. The upper end of the outer shaft 21 also includes a mounting head 23 for mounting the central disk 12. As noted in FIG. 3, the head 23 is circular, having a hollow center region. The upper surface of the head 23 has mounting holes and vacuum holes which align with corresponding holes 18, 19 present on the central disk 12. The head 23 also has slots 26 (three in this instance) corresponding to the extensions 16 of the base plate 11, for accommodating the placement of the base plate 11.

The inner shaft 22 includes a platform 24, which is shaped similar to the extensions 16, so that the extensions 16 of the base plate 11 rest onto the platform 24. The inner shaft 22 resides within the hollow center of the outer shaft 21. As shown in the cross-sectional diagram of FIG. 4, the shaft assembly is a dual shaft unit having the inner shaft 22 fitted within the outer shaft 21. Bushings and bearings are employed for the placement of the inner shaft 22 within the outer shaft 21.

When assembled together, the inner shaft 22 resides within the outer shaft 21 and having the head extensions fitted within the slots 26. Both shafts 21, 22 are capable of rotating in unison. Also both shafts 21, 22 can move vertically (up-down) in unison, as well as independently from one another. The base plate 11 is then placed onto the shaft assembly, by having the extensions 16 reside on the platform 24, so that the extensions 16 are placed into the slots 26. The central disk 12 is then placed into the center opening 15 and the holes 18, 19 are aligned to respective holes on the head 23. Fasteners 14 are then used to affix (mount) the disk 12 onto the head 23.

When the assembly is completed, the central disk 12 is mounted rigidly to the mounting head 23 of the outer shaft 21. The base plate 11 is not affixed rigidly, allowing the base plate to move vertically within the slot 26. The bottom stop is provided by the head 23 (bottom of the slot) and the upper stop is provided by the disk 12. By moving the inner shaft 22 vertically relative to outer shaft 21, the base plate 11 can be made to move up-down relative to the central disk 12 (see FIG. 7).

Furthermore, with the preferred embodiment, the platform 24 is a flexure (also noted as flexure 24), which allows the extensions 25 to be flexible. A material having resilience is utilized so that some amount of flexibility is provided. The flexure permits the base plate 11 to tilt slightly in a given direction, so that the base plate 11 can tilt relative to the central disk 12. The reason for this tilt is described below.

FIG. 4 shows the placement of the chuck 10, having a wafer 30 residing on the surface of the plates 11 and 12, engaged to a processing chamber. Initially, the wafer 30 is loaded onto the chuck 10 when the chuck is in a lowered position (see FIG. 7). Once the wafer is loaded on to the chuck 10, the shaft assembly 20 is raised to raise the wafer upward to engage the processing chamber. Also, in the preferred embodiment, vacuum (low pressure) channels 29 extend through the shaft assembly, mounting head 23 and central disk 12 to the openings 19 for the purpose of retaining the wafer 30 on the disk 12. The O-ring 13 provides a tight seal around the disk 12 to maintain vacuum integrity, once the wafer 30 is placed onto the disk 12.

Generally, the edge of the wafer extends at least to the outer rim (or edge) of the wafer chuck 10. FIG. 4 shows the placement of the wafer 30 in the processing position. Although the wafer chuck 10 can be utilized in a variety of processing chambers, the preferred technique is to use the chuck 10 in a chamber where the wafer functions as the floor of the containment vessel. Accordingly, a processing chamber 40 is shown having a sleeve 41, which functions as the sidewall for the containment vessel (or region) 42 for retaining a processing fluid. When the sleeve 41 engages the wafer 30, the wafer 30 forms the floor of the containment vessel 42. Where the wafer 30 engages the bottom surface of the sleeve 41, a gasket, O-ring or some other elastomer is used as a seal 37 at this junction to seal in the processing fluid. The processing fluid is then introduced in the chamber to process the wafer 30.

An example of a processing chamber that may be used with the present invention is described in detail in U.S. Patent Application entitled "Process Chamber and Method for Depositing and/or Removing Material on a Substrate;" Ser. No. 08/916,564; filed Aug. 22, 1997. Another example of a processing chamber that may be used with the present invention is described in detail in U.S. Patent Application entitled "Method and Apparatus for the Disposal of Processing Fluid Used to Deposit and/or Remove Material on a Substrate;" Ser. No. 09/118,362; filed Jul. 17, 1998. Both applications are assigned to the Assignee of this application.

It is appreciated that the chamber 40 can be utilized for holding a variety of processing fluids. However, the chamber of the preferred embodiment utilizes a liquid electrolyte for electroplating (depositing) or electropolishing (removing) metal, including copper material, onto/from the wafer 30. The technique of electroplating and electropolishing materials, such as copper, are known in the art and the above-mentioned applications also describe techniques for performing such processing. Accordingly, for electroplating, an anode electrode 45 is disposed on an anode shaft 46 and located within the containment vessel 42. Cathode electrodes 47 (shown in detail in FIG. 5) are dispersed along the periphery of the wafer 30 so as not to contact the processing fluid.

Figure 5:
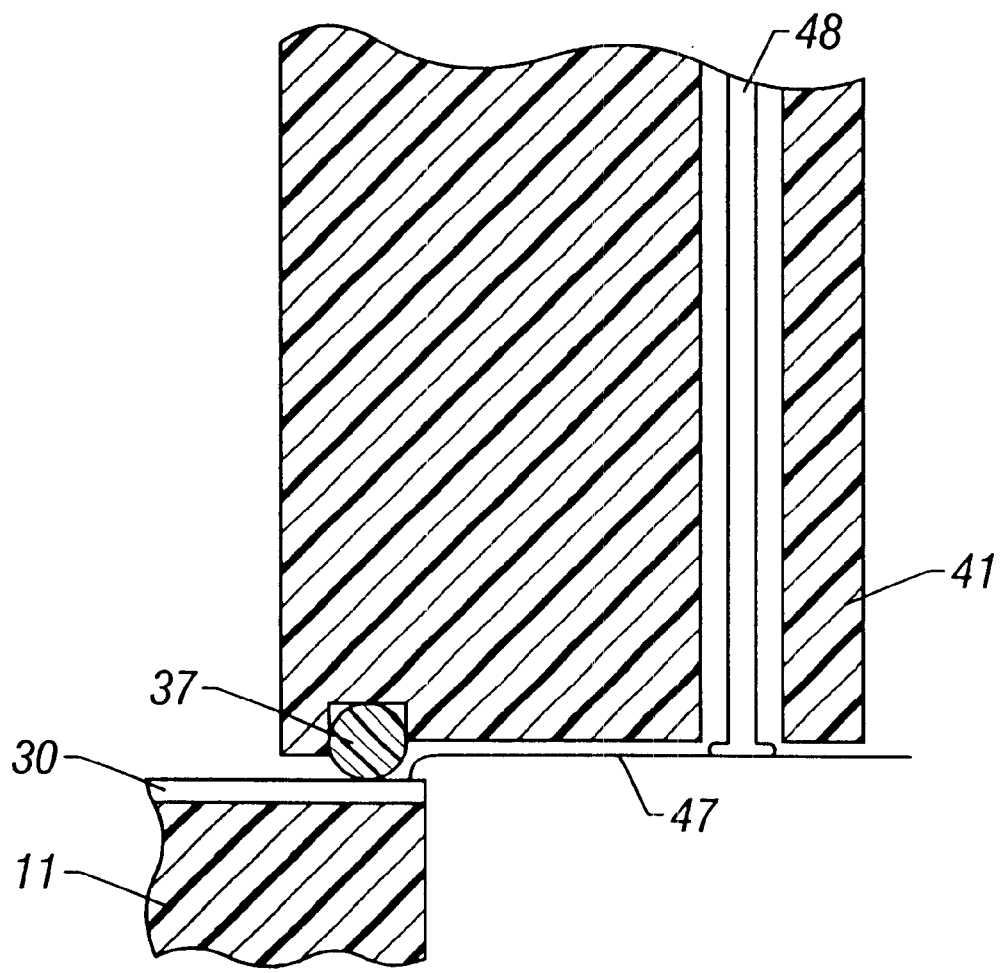
FIG. 5 is an enlarged cross-sectional view showing a portion of the wafer engaging a sleeve to form the containment vessel.

As shown in FIG. 5, the sleeve 41 engages the edge of the wafer 30 and the seal 37 prevents fluid leakage at the bottom of the containment vessel. A conductor 48 extends vertically through the sleeve wall to provide an electrical contact to the cathode electrode 47. The end of the cathode electrode 47 contacts the edge of the wafer on the protected side of the seal 37. A number of such cathodes 47 are distributed around the circumference of the wafer edge to provide multiple cathode contacts to the wafer. Accordingly, when electroplating, electrolyte is introduced and a voltage potential applied across the anode and the cathode(s), and the electroplating of metal, such as copper, is achieved.

For electropolishing, the anode and cathode(s) are reversed so that electrode 45 operates as the cathode and electrode(s) 47 operate as the anode(s). Electropolishing electrolyte is introduced as the processing fluid to remove metal, such as copper, from the wafer surface. It is appreciated that the wafer chuck 10 of the present invention can be utilized in a variety of chambers and need not be limited to the electroplating and/or electropolishing of metal materials. Furthermore, the wafer processing fluid need not be limited to processing liquids and can be a gas or plasma.

As noted in FIG. 4, when the wafer 30 is raised to engage the sleeve 41, the inner shaft is raised to have the base plate 11 support the underside of the wafer 30. The planar surface of the two plates 11, 12 support the wafer across the whole surface. The vacuum on the central disk 12 retains the wafer in position. A slight gap 35 exists where the edges of the two plates 11, 12 meet, which allows the base plate 11 to move relative to the central disk plate 12. An O-ring or a low-friction surface could be used at the mating sides of the two plates 11, 12, if desired.

Figure 6:
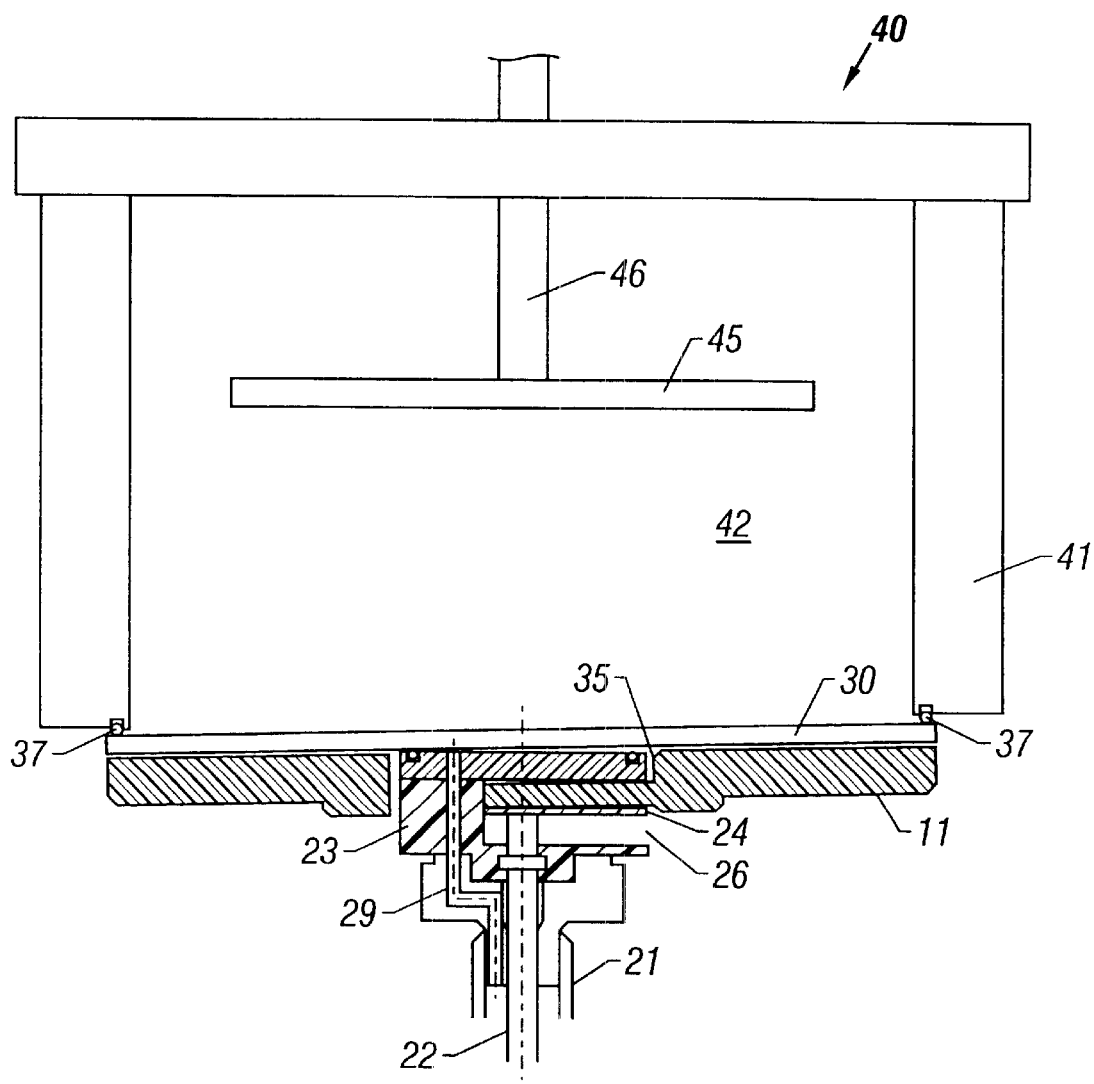
FIG. 6 is a cross-sectional view of the two-piece chuck of the preferred embodiment, illustrating the operation of the compliant nature of the chuck in tilting the wafer to maintain proper engagement of the wafer to the sleeve.

Referring to FIG. 6, a compliant nature of the wafer chuck 10 of the preferred embodiment is illustrated. The chamber 40 is the same chamber as shown in FIG. 4, but now the sleeve 41 at the right side of the drawing is slightly less in height than the left side of the drawing. If a prior art chuck, having a rigid chuck configuration, had been utilized, a gap separation at the short side of the sleeve would have been larger than at the opposite side. If the gap separation exceeded the tolerance, leakage would have occurred. Appreciable tolerance variations can occur at a particular region of the rim of the wafer during use after the chuck 10 and the sleeve 41 are initially aligned. Typically, manual adjustment (which requires time to perform) or replacement of components (which also requires time to perform) would be required to correct the problem. Accordingly, prior art chucks require precise tolerances at the wafer-sleeve interface so that when the sleeve engages the wafer, substantial gaps are not present. This precise tolerance is difficult to maintain over time.

The wafer chuck 10 of the present invention performs the tolerance adjustment automatically. As shown in FIG. 6, if there is a tolerance variation at one location, the base plate 11 is able to tilt to compensate for the excessive gap. Thus in the example, where the sleeve portion at the left extends slightly lower than the sleeve portion at the right, the wafer 30 is made to tilt to compensate for the difference. When the wafer 30 is placed on the chuck 10 and raised to meet the sleeve, the wafer edge engages the sleeve 41. The base plate 11 tilts to compensate for the difference in the engaging pressure between the edge regions. Thus, the base plate 11 and the wafer edge on the right tilts upward to engage the sleeve.

As shown in FIG. 6, the base plate 11 and the wafer 30 are tilted in order to adjust to the tolerance variation between the two locations. The adjustment is performed automatically as the wafer 30 engages the sleeve 41. The self-adjustment allows for a fairly uniform gap separation of 0.001 in. around the circumference of the wafer where the wafer surface engages the sleeve 41. Thus, the chuck 10 is made compliant to engaging the sleeve 41. Since it is self-adjusting, wafer processing repeatability is improved, allowing for repeated processing of wafers before manual adjustments are required.

Furthermore, since the central disk 12 does not tilt and the vacuum openings 19 retain the wafer 30 on to the chuck's surface, the wafer is centered and retained on the chuck 10, even when it is tilted. When the wafer is disengaged or if the tilt angle changes, the wafer will still maintain its central position.

Once the processing is completed, the wafer needs to be rinsed prior to unloading from the chuck to remove any remaining electrolyte. The wash and rinse cycle is performed with the wafer in a lowered position, disengaged from the sleeve 41. First the shaft assembly 20 is lowered to lower the wafer 30. The chuck may be rotated as part of a wash and rinse cycle.

As noted earlier in the Background section, wetting on the underside of the wafer can present problems with prior art chucks. During the rinsing procedure, there is a tendency for the liquid (typically, de-ionized water) to penetrate between the underside of the wafer and the chuck surface with prior art chucks. Even if a seal is present, the water penetration is likely. With prior art chucks, the chuck is in close proximity to the edge of the wafer, so that the liquid can easily enter the region between the underside of the wafer and the surface of the chuck. Also, the presence of vacuum on the chuck surface also attracts the liquid. The vacuum, not only attracts the liquid, but also can retain the liquid in the vacuum opening or channel. Once liquid penetration occurs in the region between the underside of the wafer and the chuck surface, it is difficult to remove it during a spin dry cycle.

Furthermore, when the vacuum is removed, the liquid retaining in the vacuum opening ejects the liquid and wets the underside of the wafer. When the wafer is removed, the liquid is present on the underside of the wafer. Thus, the wafer can be wetted even after a drying cycle.

Figure 7:
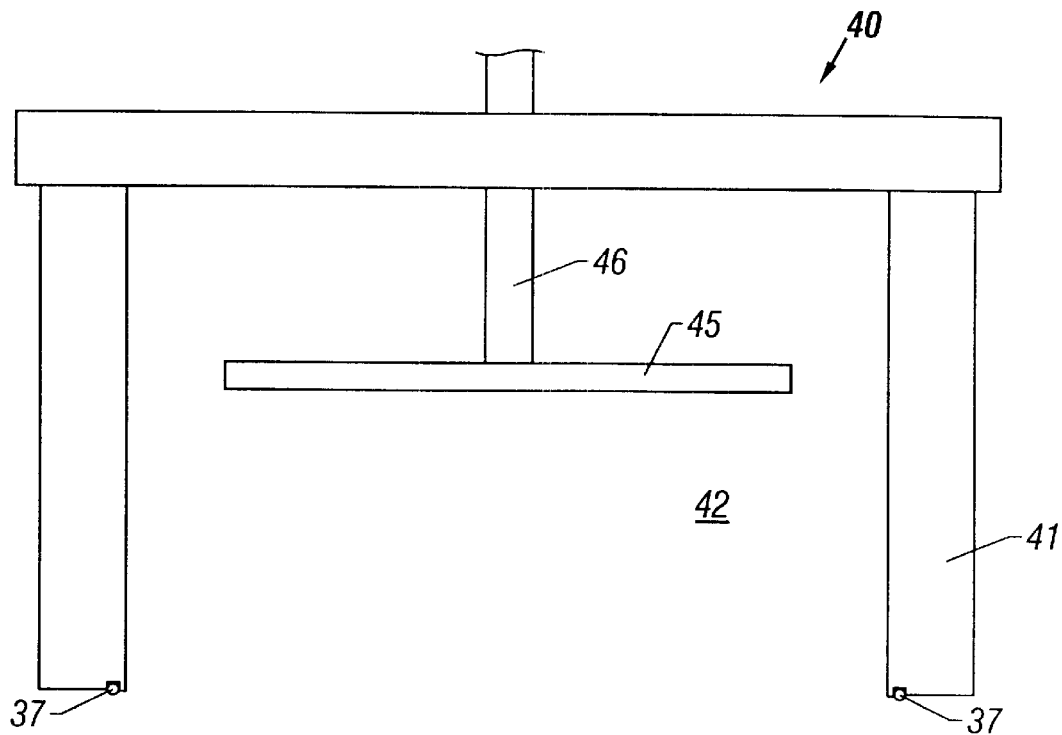
FIG. 7 is a cross-sectional view of the two-piece chuck of the preferred embodiment when it is lowered to a wafer load/unload and/or wash/rinse position, in which a base plate of the chuck is lowered to expose underlying areas of the wafer.
Figure 7:
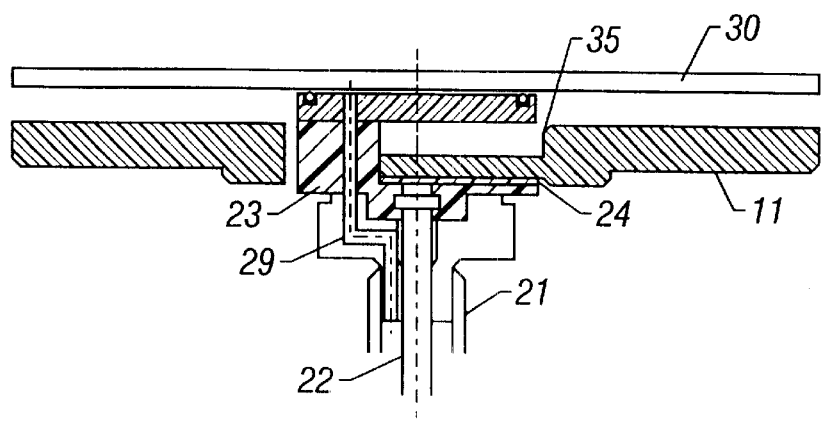

The chuck 10 of the preferred embodiment prevents or significantly inhibits the collecting of rinsing liquid from collecting on or wetting the underside of the wafer 30. As shown in FIG. 7, when the chuck assembly 10 is lowered to a disengaged position, the inner shaft 22 is lowered further relative to the outer shaft 21, so that the surface of the base plate 11 is made to reside below the surface level of the central disk 12. The wafer is still held by the vacuum along the surface of the central disk 12, but the underside region of the wafer 30 overlying the base plate 11 is exposed. Since the rinsing liquid is typically sprayed from above to wash and rinse the processing face of the wafer 30, most of the liquid flows off or is spun off the wafer surface. Any liquid reaching the underside of the wafer (for example, by tricking around the edge of the wafer) is not captured in a tight or confined area. Any liquid reaching this underside of the wafer 30 is also easily removed during a drying and/or spin cycle for removing the liquid from the upper surface of the wafer 30.

Furthermore, since the central disk 12 having the vacuum openings is at a substantial distance from the wafer's edge, there is very little chance that the liquid will work the distance from the edge of the wafer to the central disk 12 and penetrate between the wafer and the disk 12. Additionally, the seal 13, not only retains the vacuum in the disk surface region, but also prevents or inhibits liquid penetration.

The lowering of the base plate 11 relative to the central disk 11 also allows the wafer to be loaded or unloaded easily. Since a gap exists between the wafer and the base plate 11, a wafer handling tool (such as a pair of robotic fingers) can be inserted under the wafer 35 and lift it off of the central disk, once vacuum is turned off. Equivalently, the device can also load the wafer onto the central disk 12 during loading procedure with the base plate 11 at the lowered position. Subsequently, the base plate 11 can be raised to support the wafer once the loading mechanism is retracted.

Accordingly, the two-piece chuck of the present invention provides for a tight tolerance between the wafer and the sleeve, which tolerance can be in the order of 0.001 in. This tight tolerance can be maintained for a large diameter wafer. Thus, seal integrity of the chamber can be maintained around the circumference of 200 mm, 300 mm or greater wafers. Because of the compliant nature of the chuck to self-adjust to tolerance differences, a smaller (thinner) O-ring at the bottom of the sleeve can be employed and in some instances, the O-ring may not be necessary.

It is also appreciated that the free movement of the base plate and its flexibility as it resides on a flexure, allows the base plate to tilt, allowing for the wafer to tilt as well. Furthermore, due to the separation of the two plates 11, 12 of the chuck 10, unwanted underside wetting of the wafer is prevented.

The components of the chuck 10 can be manufactured from a variety of materials. In the preferred embodiment, the chuck plates 11 and 12 can be made from plastic materials. The sleeve is also made from plastic. It is appreciated that metals, ceramic, quartz, etc. can also be used. Metals, such as stainless steel or titanium, as well as others, can also be used. The flexure 24 can be constructed from a resilient material with some flexibility, including plastics, rubber, composite materials, as well as others. The material selected should be compatible with the processing fluid being utilized.

Thus, a two-piece chuck is described. Although the chuck is described in reference to a semiconductor wafer, the chuck can be readily used on other substrates as well, including substrates used for manufacturing flat panel displays.

I claim:

1. An apparatus comprising:
    a base support having a central open region, said base support for supporting an outer peripheral area of a substrate residing thereon when said substrate is forming a bottom of a processing chamber by sealing an opening in said processing chamber; and;
    a central disk residing within the central open region for contacting and supporting the substrate on a same side of the substrate as the base support and for mounting onto a shalt assembly, said central disk coupled to said base support to allow said base support to tilt relative to said central disk.

2. The apparatus of claim 1 wherein said base plate has support extensions across the bottom of the central open region for coupling the base plate to an underling platform for raising and lowering said base plate relative to said central disk.

3. The apparatus of claim 2 wherein the underlying platform is a flexure which allows said base plate to tilt relative to said central disk.

4. The apparatus of claim 1 further including a shaft assembly comprised of an inner shaft and an outer shaft, in which said central disk is coupled to the outer shaft and the base plate resides on the platform coupled to the inner shaft, said inner shaft.

5. A wafer chuck comprising:
    a base plate having a central open region, said base plate for supporting an outer peripheral area of a wafer residing thereon when said substrate is forming a bottom of a processing chamber by scaling an opening in said processing chamber; and
    a central disk residing within the central open region for contacting and supporting the wafer on a same side of the wafer as the base plate and for mounting onto a shaft assembly, said central disk coupled to said base plate to allow said base plate to tilt relative to said central disk.

6. The wafer chuck of claim 5 wherein said base plate has support extensions across the bottom of the central open region for coupling the base plate to an underling platform for raising and lowering said base plate relative to said central disk.

7. The wafer chuck of claim 6 wherein the support extensions are fingers extending to the center and joined at the center, and the platform is correspondingly shaped to support the base plate thereon.

8. The wafer chuck of claim 7 wherein the underlying platform is a flexure which allows said base plate to tilt relative to said central disk.

9. The wafer chuck of claim 8 further including a shaft assembly comprised of an inner shaft and an outer shaft, in which said central disk is coupled to the outer shaft and said base plate resides on the platform coupled to the inner shaft, said inner shaft moving vertically relative to the outer shaft.

10. The wafer chuck of claim 5 further including a shaft assembly comprised of an inner shaft and an outer shaft, in which said central disk is coupled to the outer shaft and said base plate resides on the platform coupled to the inner shaft, said inner shaft moving vertically relative to the outer shaft.

11. The apparatus of claim 1, wherein said central disk is coupled to said base support to allow said base support to move vertically relative to said central disk to disengage the outer peripheral area of the substrate from said base support while the substrate is still supported by said central disk.

12. The wafer chuck of claim 5, wherein said central disk is coupled to said base plate to allow said base plate to move vertically relative to said central disk to disengage the outer peripheral area of the wafer from said base plate while the wafer is still supported by said central disk.

* * * * *